(12) United States Patent
Wu et al.

(10) Patent No.: US 10,692,907 B2
(45) Date of Patent: Jun. 23, 2020

(54) CMOS IMAGE SENSOR ENCAPSULATION STRUCTURE AND METHOD FOR MANUFACTURING THE SAME

(71) Applicant: Pioneer Materials Inc. Chengdu, Chengdu, Sichuan (CN)

(72) Inventors: Chen-Hsin Wu, Sichuan (CN); Liu-Yuh Lin, Sichuan (CN); Liang-Chih Weng, Sichuan (CN); Tzu-Huan Cheng, Sichuan (CN); Hao-Che Liu, Sichuan (CN); Chien-Chun Liu, Sichuan (CN); Chien-Yao Huang, Sichuan (CN); Leon A. Chiu, Sichuan (CN); Sau-Mou Wu, Sichuan (CN); Ti-Hsien Tai, Sichuan (CN); Yu-Hsiang Pan, Sichuan (CN)

(73) Assignee: Pioneer Materials inc. Chengdu, Chengdu (CN)

( * ) Notice: Subject to any disclaimer, the term of this patent is extended or adjusted under 35 U.S.C. 154(b) by 0 days.

(21) Appl. No.: 16/203,752

(22) Filed: Nov. 29, 2018

(65) Prior Publication Data
US 2019/0198544 A1 Jun. 27, 2019

(30) Foreign Application Priority Data
Dec. 22, 2017 (CN) .......................... 2017 1 1415006

(51) Int. Cl.
*H01L 27/146* (2006.01)
*H01L 23/00* (2006.01)

(52) U.S. Cl.
CPC ........ *H01L 27/14618* (2013.01); *H01L 24/17* (2013.01); *H01L 27/1469* (2013.01);
(Continued)

(58) Field of Classification Search
CPC ........... H01L 27/14618; H01L 27/1469; H01L 27/14627; H01L 27/14689;
(Continued)

(56) References Cited

U.S. PATENT DOCUMENTS

2003/0113979 A1 6/2003 Bieck et al.
2008/0093696 A1* 4/2008 Takao ............... H01L 27/14623
257/432

(Continued)

FOREIGN PATENT DOCUMENTS

CN 101847664 A 9/2010
CN 101996899 A 3/2011
(Continued)

*Primary Examiner* — Sitaramarao S Yechuri
(74) *Attorney, Agent, or Firm* — Berggren LLP

(57) ABSTRACT

Disclosed are a CMOS image sensor encapsulation structure and a method for manufacturing the same, including the steps of: firstly, a transparent substrate material is fixed to a surface of a first insulating layer having a micro convex lens, a dummy wafer is fixed on a surface of the transparent substrate material, and then a wafer is thinned by grinding, and in this process, the transparent substrate material provides more mechanical support force for the wafer, therefore, the wafer can become thinner by grinding, thus the CMOS image sensor encapsulation structure is characterized by being formed in a thin shape. Besides, a second installation area has a protection glue layer which can prevent oxygen and moisture from entering internal elements and absorb scattered light.

16 Claims, 4 Drawing Sheets

(52) U.S. Cl.
CPC .. *H01L 27/14627* (2013.01); *H01L 27/14632* (2013.01); *H01L 27/14643* (2013.01); *H01L 27/14689* (2013.01)

(58) Field of Classification Search
CPC ......... H01L 27/14687; H01L 27/14643; H01L 27/14632; H01L 24/17
See application file for complete search history.

(56) References Cited

U.S. PATENT DOCUMENTS

| | | | | |
|---|---|---|---|---|
| 2009/0206434 | A1* | 8/2009 | Hashimoto | ....... H01L 27/14623 257/432 |
| 2013/0168791 | A1 | 7/2013 | Oganesian | |
| 2013/0264688 | A1* | 10/2013 | Qian | ....... H01L 24/80 257/622 |
| 2014/0014813 | A1* | 1/2014 | Mao | .................. H01L 27/14623 250/208.1 |
| 2015/0035104 | A1* | 2/2015 | Horikoshi | ......... H01L 27/14627 257/432 |
| 2016/0351604 | A1* | 12/2016 | Kalnitsky | ......... H01L 27/14689 |
| 2017/0287812 | A1* | 10/2017 | Safran | ................... H01L 23/481 |
| 2018/0040584 | A1* | 2/2018 | Kang | ......... H01L 27/14634 |
| 2019/0157322 | A1* | 5/2019 | Li | ........................ H01L 27/1463 |
| 2019/0305049 | A1* | 10/2019 | Park | .................. H01L 27/14627 |

FOREIGN PATENT DOCUMENTS

| | | |
|---|---|---|
| CN | 102237378 A | 11/2011 |
| CN | 102365744 A | 2/2012 |
| CN | 103000648 A | 3/2013 |
| CN | 103000649 A | 3/2013 |
| CN | 103928478 A | 7/2014 |
| CN | 105140253 A | 12/2015 |
| CN | 106206485 A | 12/2016 |

* cited by examiner

CMOS IMAGE SENSOR ENCAPSULATION STRUCTURE AND METHOD FOR MANUFACTURING THE SAME

CROSS-REFERENCE TO RELATED APPLICATIONS

The present disclosure claims the priority to the Chinese patent application with the filing No. 201711415006.5, filed on Dec. 22, 2017 with the State Intellectual Property Office (SIPO) of the People's Republic of China, entitled "CMOS Image Sensor Encapsulation Structure and Method for Manufacturing the Same", which is incorporated herein by reference in its entirety.

TECHNICAL FIELD

The present disclosure relates to the technical field of image sensors, and particularly to a CMOS image sensor encapsulation structure and a method for manufacturing the same.

BACKGROUND ART

A CMOS (abbreviation of Complementary Metal-Oxide Semiconductor) sensor, being a type of image sensor, is usually a core part of digital cameras.

Currently, conventional CMOS sensors have a problem that their encapsulation structure has a relatively large thickness.

SUMMARY

Objects of the present disclosure include providing a method for manufacturing a CMOS image sensor encapsulation structure, by which a CMOS image sensor encapsulation structure having a relatively small thickness can be manufactured, with a feature of its relative long service life.

Objects of the present disclosure further include providing a CMOS image sensor encapsulation structure which is characterized in that the structure is formed in a thin shape.

The present disclosure is implemented as follows.

A method for manufacturing a CMOS image sensor encapsulation structure, comprising:

forming a blind hole in a combined layer formed by a first insulating layer and a wafer, wherein the blind hole passes through the first insulating layer and a hole bottom is located on the wafer, a surface of the first insulating layer facing away from the wafer is provided with a micro convex lens; areas where the micro convex lens and the blind hole are located are a first installation area and a second installation area, respectively, the first installation area and the second installation area do not overlap each other;

forming a second insulating layer on a hole wall of the blind hole, filling an electrically conductive material in the blind hole having the second insulating layer, and making a conductor (wire) in the combined layer extend to a surface of the first insulating layer to be electrically connected to the electrically conductive material, with the conductor in signal connection with the micro convex lens and an IC;

fixing the transparent substrate material on a surface of the first insulating layer, with the surface having the micro convex lens, and providing the transparent substrate material in the first installation area; fixing a dummy wafer on a surface of the transparent substrate material, and thinning the wafer by grinding such that the electrically conductive material in the blind hole is exposed;

forming a third insulating layer on a surface of the wafer that is thinned by grinding and exposing the electrically conductive material, forming metal projections (bumps) on the third insulating layer and electrically connecting the metal projections to the electrically conductive material, fixing solder balls on the metal projections, and after removing the dummy wafer, forming a protection glue (adhesive) layer on the first insulating layer, and the protection glue layer is located in the second installation area.

Furthermore, in an example of the present disclosure, the wafer before being thinned by grinding has a thickness of 700~1000 μm, and the wafer after being thinned by grinding has a thickness of 20~1000 μm Furthermore, in an example of the present disclosure, the wafer after being thinned by grinding has a thickness of 40~70 μm.

Furthermore, in an example of the present disclosure, the protection glue layer is flush with a surface of the transparent substrate material.

Furthermore, in an example of the present disclosure, the electrically conductive material includes copper, silver, or gold.

Furthermore, in an example of the present disclosure, the transparent substrate material is fixed to the surface of the first insulating layer by a light-transmissive adhesive glue.

Furthermore, in an example of the present disclosure, the light-transmissive adhesive glue contacts a whole plane of the transparent substrate material.

Furthermore, in an example of the present disclosure, materials of the transparent substrate material include sapphire, quartz glass and magnesium oxide.

Furthermore, in an example of the present disclosure, the solder balls are welded to the metal projections.

A CMOS image sensor encapsulation structure is provided. The structure includes a first insulating layer, a wafer, a second insulating layer, a transparent substrate material, and a dummy wafer; the first insulating layer is provided on a side of the wafer and forms a combined layer together with the wafer, each of the two sides of the combined layer are respectively provided with a blind hole, the blind holes pass through the first insulating layer and hole bottoms are located on the wafer, a surface of the first insulating layer facing away from the wafer is provided with a micro convex lens, areas where the micro convex lens and the blind holes are located are a first installation area and a second installation area, respectively, the first installation area and the second installation area do not overlap each other; the second insulating layer is provided on hole walls of the blind holes, and an electrically conductive material is accommodated in the blind holes provided with the second insulating layer, and a conductor located in the combined layer is electrically connected to the electrically conductive material, with the conductor in signal connection with both the micro convex lens and an IC; the transparent substrate material is fixed on a surface of the first insulating layer, with the surface provided with the micro convex lens, and the dummy wafer is provided on a surface of the transparent substrate material, so as to thin the wafer by grinding such that the electrically conductive material in the blind holes is exposed.

Furthermore, the CMOS image sensor encapsulation structure further includes a third insulating layer, wherein the third insulating layer is formed on a surface of the wafer that is thinned by grinding, such that the electrically conductive material is exposed.

Furthermore, the CMOS image sensor encapsulation structure further includes metal projections and solder balls, wherein the metal projections are formed on the third insulating layer and are electrically connected to the electrically conductive material, and the solder balls are fixed on the metal projections, such that the metal projections are electrically connected to a system base board via the solder balls.

Furthermore, the CMOS image sensor encapsulation structure further includes a protection glue layer, wherein the protection glue layer configured to be formed on the first insulating layer after the dummy wafer is removed, and the protection glue layer is located in the second installation area so as to prevent oxygen and moisture from entering the structure.

Furthermore, the transparent substrate material is fixed to the surface of the first insulating layer by a light-transmissive adhesive glue.

Furthermore, materials of the transparent substrate material include sapphire, quartz glass and magnesium oxide.

Furthermore, the wafer before being thinned by grinding has a thickness of 700~1000 μm, and the wafer after being thinned by grinding has a thickness of 20~100 μm.

Furthermore, the wafer after being thinned by grinding has a thickness of 40~70 μm.

Furthermore, the electrically conductive material includes copper, silver, or gold.

The present disclosure has the following beneficial effects: with the method for manufacturing a CMOS image sensor encapsulation structure provided in the examples of the present disclosure, in the process of manufacturing the CMOS image sensor encapsulation structure, firstly, the transparent substrate material is fixed to the surface of the first insulating layer, with the surface having the micro convex lens, the dummy wafer is fixed on the surface of the transparent substrate material, and then the wafer is thinned by grinding, and in this process, the transparent substrate material provides more mechanical support forces for the wafer, therefore, the wafer can become thinner by grinding, thus the CMOS image sensor encapsulation structure is characterized by being formed in a thin shape. Besides, the second installation area has a protection glue layer which can prevent oxygen and moisture from entering internal elements and absorb scattered light, thus the whole CMOS image sensor encapsulation structure has a longer service life and better use effects. Moreover, in the manufacture process, the transparent substrate material is manufactured in a semiconductor factory, thus the cleanliness is higher, and pollution to the CMOS image sensor encapsulation structure can be avoided.

BRIEF DESCRIPTION OF DRAWINGS

In order to more clearly illustrate technical solutions of embodiments of the present disclosure, accompanying drawings which are needed for description of the embodiments will be introduced briefly below. It should be understood that the accompanying drawings below merely show some examples of the present disclosure, and therefore should not be considered as limiting the scope. A person ordinarily skilled in the art still can obtain other relevant drawings according to these accompanying drawings without any inventive effort.

REFERENCE SIGNS

Figure 1:
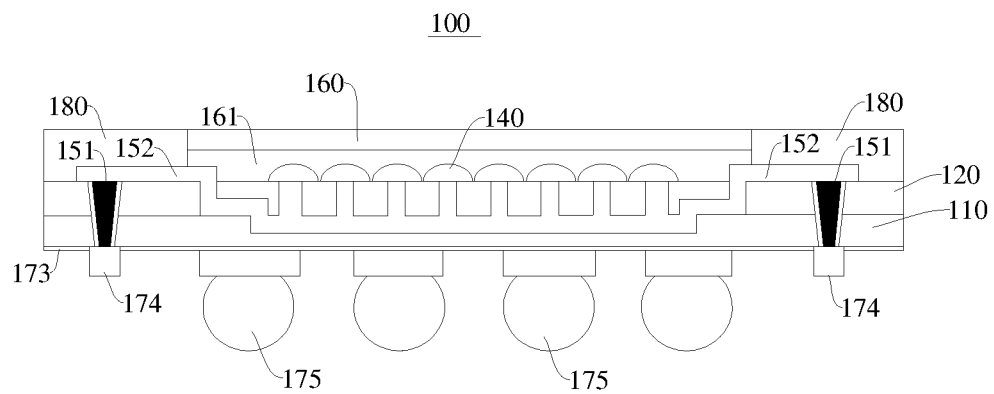
FIG. 1 is a schematic structural diagram of a CMOS image sensor encapsulation structure provided in an example of the present disclosure.

100—CMOS image sensor encapsulation structure; 110—wafer; 120—first insulating layer; 130—blind hole;

140—micro convex lens; 150—second insulating layer; 151—electrically conductive material; 152—conductor; 160—transparent substrate material; 161—high-light-transmittance adhesive glue; 170—dummy wafer; 171—first installation area; 172—second installation area; 173—third insulating layer; 174—metal projection; 175—solder ball; 180—protection glue layer.

DETAILED DESCRIPTION OF EMBODIMENTS

In order to make the objects, technical solutions and advantages of the embodiments of the present disclosure clearer, below the technical solutions in the embodiments of the present disclosure will be described clearly and completely in conjunction with the accompanying drawings in the embodiments of the present disclosure. Apparently, some but not all embodiments of the present disclosure are described. Based on the embodiments of the present disclosure, all the other embodiments, obtained by a person ordinarily skilled in the art without using inventive effort, should fall within the scope of protection of the present disclosure Therefore, the detailed description below of the embodiments of the present disclosure provided in the accompanying drawings is not intended to limit the scope of protection of the present disclosure, but merely represents chosen embodiments of the present disclosure. Based on the embodiments of the present disclosure, all the other embodiments, which a person ordinarily skilled in the art obtains without using inventive effort, fall within the scope of protection of the present disclosure.

It should be noted that similar reference signs and letters represent similar items in the following accompanying drawings, therefore, once a certain item is defined in one accompanying drawing, it is not needed to be further defined or explained in subsequent accompanying drawings.

In the description of the present disclosure, it should be understood that orientational or positional relations indicated by terms "thickness", "upper", "lower", and so on are based on orientational or positional relations as shown in the accompanying drawings, merely for facilitating describing the present disclosure and simplifying the description, rather than indicating or implying that related devices or elements have to be in the specific orientation or configured and operated in the specific orientation, and therefore, they should not be construed as limiting the present disclosure.

Besides, terms "first", "second", and "third" are merely for descriptive purpose, and should not be construed as indicating or implying relative importance or implicitly indicating the number of a related technical feature. Thus, for a feature defined with "first", "second", or "third", it may explicitly or implicitly indicate that one or more such features are included.

In the present disclosure, unless otherwise specified and defined explicitly, terms "mount", "provide", "fix", and so on should be construed in a broad sense. For example, a connection can be a fixed connection, a detachable connection, or an integrated connection; it can be a direct connection, an indirect connection via an intermediate medium, or an internal communication between two elements or interaction relation between two elements. For a person ordinarily skilled in the art, specific meanings of the above-mentioned terms in the present disclosure can be understood according to specific circumstances.

EXAMPLE

The present example provides a method for manufacturing a CMOS image sensor encapsulation structure 100. The CMOS image sensor encapsulation structure 100 manufactured using this method is characterized in that the structure is formed in a thin shape and with a long service life, referring to FIG. 1. Moreover, in a manufacture process, a transparent substrate material 160 is manufactured in a semiconductor factory, thus the cleanliness is higher, and pollution to the CMOS image sensor encapsulation structure 100 can be avoided.

Figure 2A:
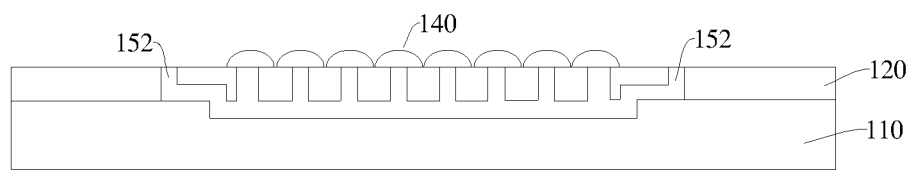
FIG. 2A is a schematic structural diagram of the CMOS image sensor encapsulation structure initially used when Step S1 is carried out in a method for manufacturing a CMOS image sensor encapsulation structure provided in an example of the present disclosure.
Figure 2B:
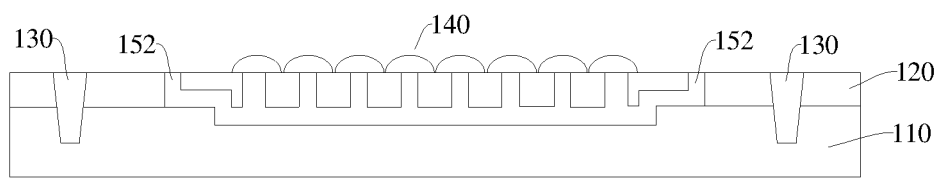
FIG. 2B is a schematic structural diagram after a blind hole is formed in a combined layer when Step S1 is carried out in the method for manufacturing a CMOS image sensor encapsulation structure provided in an example of the present disclosure.

Specifically, the method for manufacturing a CMOS image sensor encapsulation structure 100 includes the following steps:

S1: referring to FIG. 1, FIG. 2A, and FIG. 2B, a blind hole 130 is formed in a combined layer formed by a first insulating layer 120 and a wafer 110. The blind hole 130 passes through the first insulating layer 120 and a hole bottom is located on the wafer 110. A surface of the first insulating layer 120 facing away from the wafer 110 has a micro convex lens 140.

Areas where the micro convex lens 140 and the blind hole 130 are located are a first installation area 171 and a second installation area 172, respectively. The first installation area 171 and the second installation area 172 do not overlap each other. The first installation area 171 is located in a middle region of the combined layer, and the second installation area 172 is located in an edge region of the combined layer. Such arrangement benefits subsequent cutting.

Figure 3A:
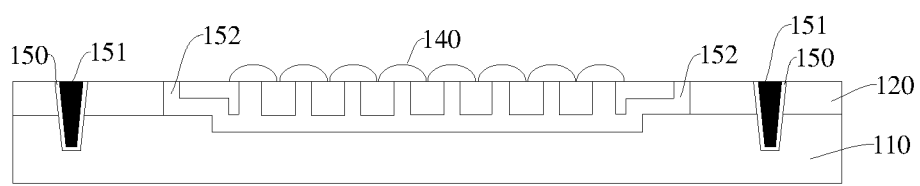
FIG. 3A is a schematic structural diagram after an electrically conductive material is filled in the blind hole having a second insulating layer when Step S2 is carried out in the method for manufacturing a CMOS image sensor encapsulation structure provided in an example of the present disclosure.
Figure 3B:
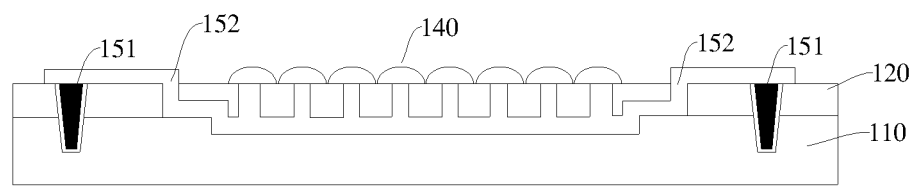
FIG. 3B is a schematic structural diagram after a conductor in the combined layer in signal connection with a micro convex lens and an IC is guided to a surface of a first insulating layer and electrically connected to an electrically conductive material when the Step S2 is carried out in the method for manufacturing a CMOS image sensor encapsulation structure provided in an example of the present disclosure.

S2: referring to FIG. 3A and FIG. 3B, a second insulating layer 150 is formed on a hole wall of the blind hole 130, then an electrically conductive material 151 is filled in the blind hole 130 having the second insulating layer 150, and a conductor 152 in the combined layer is guided to the surface of the first insulating layer 120 and electrically connected to the electrically conductive material 151, with the conductor in signal connection with the micro convex lens 140 and an IC.

It should be indicated that a position of the IC (internal elements and circuits) in the combined layer should be located above a bottom portion of the blind hole 130, in this way, damage to the IC in the combined layer can be avoided when the wafer 110 is thinned by grinding in a subsequent procedure.

Furthermore, the second insulating layer 150 is formed on the hole wall of the blind hole 130 by deposition. Besides, in a process of being formed on the hole wall of the blind hole 130, the second insulating layer 150 also may be formed on the hole bottom of the blind hole 130, but the second insulating layer 150 formed on the hole bottom of the blind hole 130 finally will also be ground off. Therefore, it is just needed to ensure that the second insulating layer 150 is formed on the hole wall of the blind hole 130.

Furthermore, in the present example, the electrically conductive material 151 includes copper and other metals with an electrically conductive effect. In other examples, the electrically conductive material 151 also can be silver, gold, aluminum, and so on. As copper is relatively cheap, and has relatively good electrical conductivity, copper is selected as the electrically conductive material 151 in the present example.

Figure 4A:
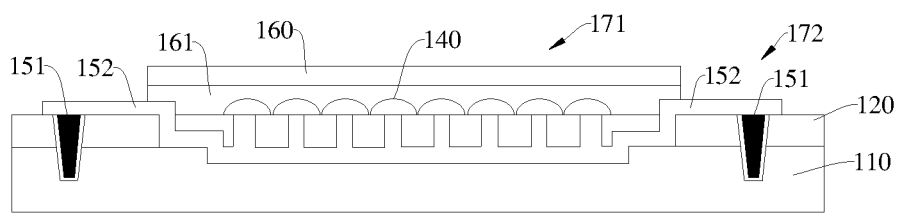
FIG. 4A is a schematic structural diagram after a transparent substrate material is fixed to a surface of the first insulating layer when Step S3 is carried out in the method for manufacturing a CMOS image sensor encapsulation structure provided in an example of the present disclosure.
Figure 4B:
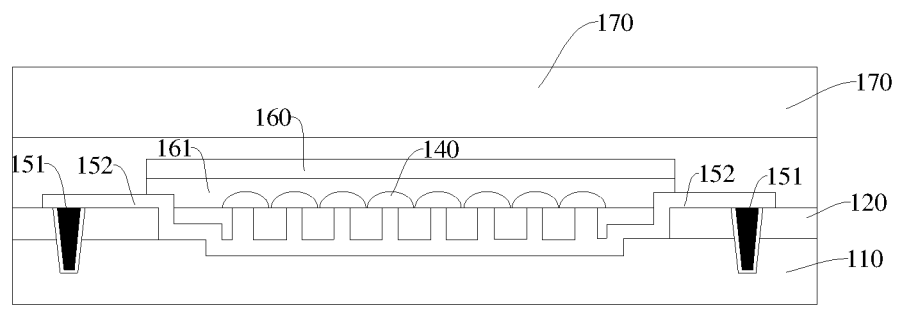
FIG. 4B is a schematic structural diagram after a dummy wafer is fixed to a surface of the transparent substrate material when Step S3 is carried out in the method for manufacturing a CMOS image sensor encapsulation structure provided in the example of the present disclosure.
Figure 4C:
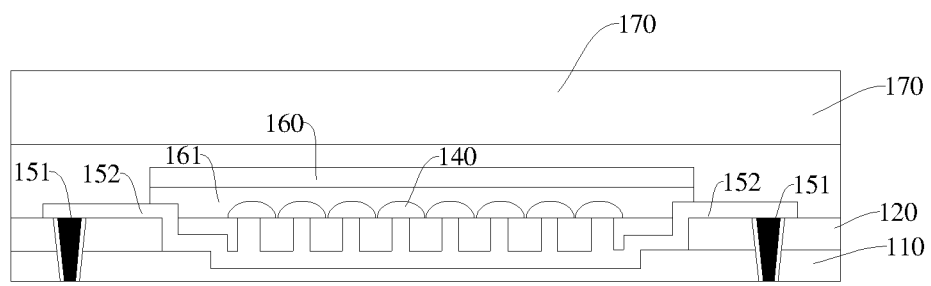
FIG. 4C is a schematic structural diagram after a wafer is thinned by grinding when Step S3 is carried out in the method for manufacturing a CMOS image sensor encapsulation structure provided in an example of the present disclosure.
Figure 5A:
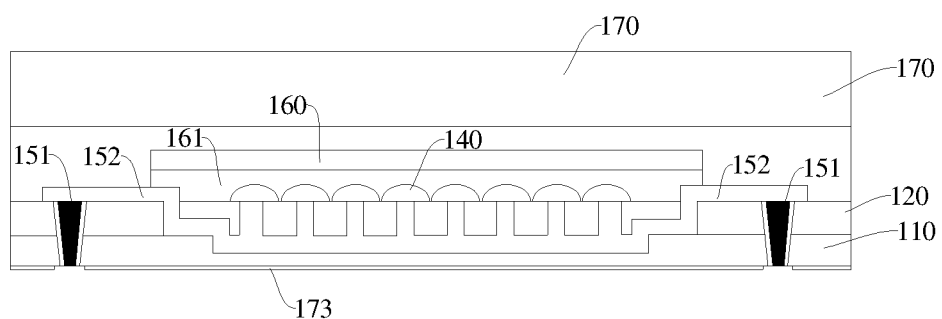
FIG. 5A is a schematic structural diagram after a third insulating layer is formed on a surface of the wafer that is thinned by grinding and the electrically conductive material is exposed when Step S4 is carried out in the method for manufacturing a CMOS image sensor encapsulation structure provided in an example of the present disclosure.
Figure 5B:
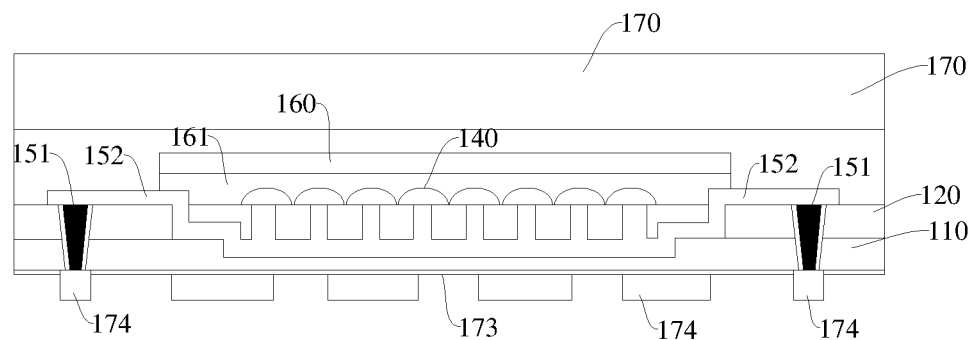
FIG. 5B is a schematic structural diagram after metal projections are formed on the third insulating layer and are electrically connected to the electrically conductive material when Step S4 is carried out in the method for manufacturing a CMOS image sensor encapsulation structure provided in an example of the present disclosure.
Figure 5C:
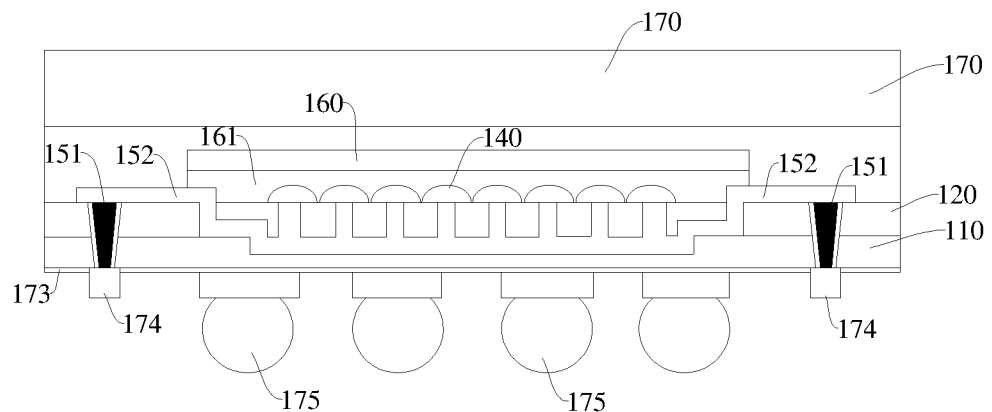
FIG. 5C is a schematic structural diagram after solder balls are welded on the metal projections when Step S4 is carried out in the method for manufacturing a CMOS image sensor encapsulation structure provided in an example of the present disclosure.
Figure 5D:
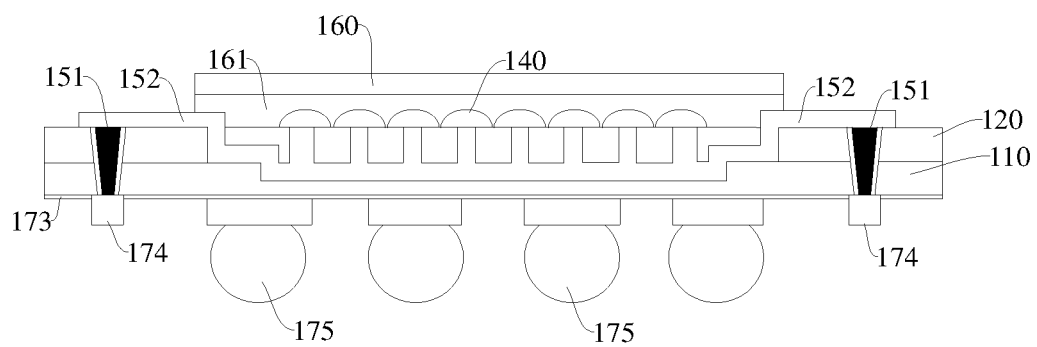
FIG. 5D is a schematic structural diagram after the dummy wafer is removed when Step S4 is carried out in the method for manufacturing a CMOS image sensor encapsulation structure provided in an example of the present disclosure.
Figure 5E:
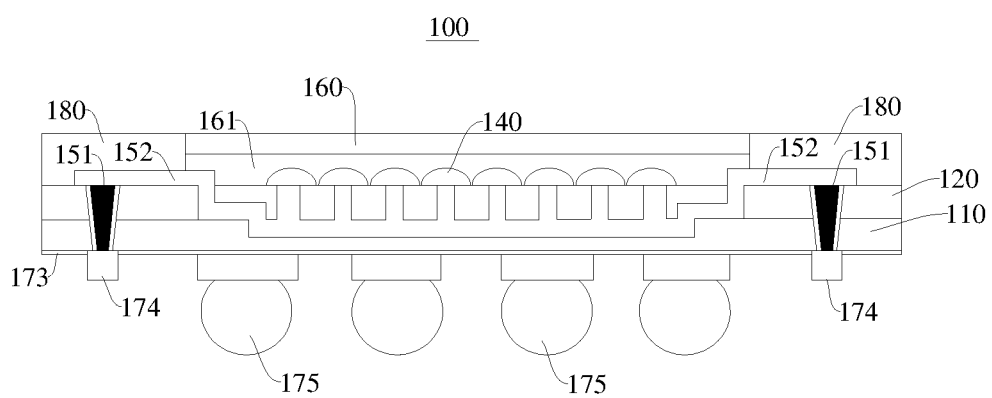
FIG. 5E is a schematic structural diagram after a protection glue layer is formed in a second installation area when the Step S4 is carried out in the method for manufacturing a CMOS image sensor encapsulation structure provided in an example of the present disclosure.

S3: referring to FIG. 4A-FIG. 4C, the transparent substrate material 160 is fixed on a surface of the first insulating layer 120, with the surface having the micro convex lens 140, and the transparent substrate material 160 is provided in the first installation area 171. The dummy wafer 170 is fixed on a surface of the transparent substrate material 160, and then the wafer 110 is thinned by grinding such that the electrically conductive material 151 in the blind hole 130 is exposed.

The transparent substrate material 160 is fixed on the surface of the first insulating layer 120, with the surface having the micro convex lens 140, and the transparent substrate material 160 can transmit light into the micro convex lens 140. The dummy wafer 170 is used to be connected to a CMP grinding head, and the CMP grinding head is used to perform a process of thinning the wafer 110 by grinding. Since the transparent substrate material 160 can provide more mechanical support force for the combined layer, when the wafer 110 is thinned by grinding, the wafer 110 can become thinner by grinding.

Furthermore, in the present example, the wafer 110 before being thinned by grinding has a thickness of 700~1000 μm, the wafer 110 after being thinned by grinding has a thickness of 20~100 μm, or the wafer 110 after being thinned by grinding has a thickness of 40~70 μm.

Furthermore, materials of the transparent substrate material 160 include sapphire, quartz glass and magnesium oxide. All of these materials are featured by relatively good light transmittance, then by using them as the transparent substrate material 160, light can better pass through the transparent substrate material 160 to be received by the micro convex lens 140.

Furthermore, the transparent substrate material 160 is fixed to the surface of the first insulating layer 120 using a light-transmissive adhesive glue. In the present example, the light-transmissive adhesive glue is a high-light-transmittance adhesive glue 161. The high-light-transmittance adhesive glue 161 not only can ensure reliability of connection of the transparent substrate material 160 to the first insulating layer 120 and to the micro convex lens 140, but also will not hinder light from passing through the transparent substrate material 160 to enter the micro convex lens 140. Besides, in the present example, the high-light-transmittance adhesive glue 161 contacts a whole plane of the transparent substrate material 160, that is, a gap between the transparent substrate material 160 and the first insulating layer 120 is filled up with the high-light-transmittance adhesive glue 161, in this way, it can be ensured that there are more contact points between the transparent substrate material 160 and the combined layer, thus a sufficient support force can be provided for the wafer 110 when being thinned by grinding.

Besides, in the present example, the dummy wafer 170 is bonded by an adhesive glue, so as to be fixed on the surface of the transparent substrate material 160. The second installation area 172 is also filled with the adhesive glue, such that the dummy wafer 170 covers the whole combined layer.

S4: referring to FIG. 5A-FIG. 5E, after the wafer 110 is thinned by grinding, a third insulating layer 173 is formed on a surface of the wafer 110 that is thinned by grinding and the electrically conductive material 151 is exposed, then metal projections 174 are formed on the third insulating layer 173 and electrically connected to the electrically conductive material 151. Solder balls 175 are welded on the metal projections 174, and then the dummy wafer 170 is removed. A protection glue layer 180 is formed on the first insulating layer 120, and the protection glue layer 180 is located in the second installation area 172.

A main function of the protection glue layer 180 is that it can prevent oxygen and moisture from entering internal elements and absorb scattered light, thus the whole CMOS image sensor encapsulation structure 100 has a longer service life and better use effects.

Furthermore, after the third insulating layer 173 is formed on the surface of the wafer 110 that is thinned by grinding, the third insulating layer 173 in a region corresponding to the electrically conductive material 151 is removed such that the electrically conductive material 151 is exposed, then a part of the metal projections 174 are formed at the electrically conductive material 151 and electrically connected to the electrically conductive material 151, and the remaining metal projections 174 are formed on a surface of the third insulating layer 173 and electrically connected to the metal projections 174 formed at the electrically conductive material 151, such that the metal projections 174 on the third insulating layer 173 are electrically connected to the electrically conductive material 151. Furthermore, a circuit in the IC (inner elements and circuits) can be guided out to the metal projections 174. The solder balls 175 are welded on the metal projections 174. An electrical signal of a chip can be connected to a system base board via the solder balls 175.

Furthermore, in the present example, the protection glue layer 180 is substantially flush with the surface of the transparent substrate material 160. The protection glue layer 180 can serve a better protective function for the CMOS image sensor encapsulation structure 100.

In the above, the protection glue layer 180 may be selected from acrylic series, epoxy resin series and silicone series produced by EVERWIDE. The protection glue layer 180 also may be selected from KET series from SHIN-ETSU. It should be indicated that the protection glue layer 180 can be selected according to practical requirements.

Furthermore, in the present example, the first insulating layer 120, the second insulating layer 150, and the third insulating layer 173 can be a material selected from the group consisting of $SiO_2$, $Si_3N_4$, BPGS (BSG borosilicate glass, borophosphate glass), an organic resin and a mixture of organic resin and inorganic resin.

The present example further provides a CMOS image sensor encapsulation structure 100, which is manufactured by the above method for manufacturing a CMOS image sensor encapsulation structure 100.

Since in the process of manufacturing the CMOS image sensor encapsulation structure 100, firstly, the transparent substrate material 160 is fixed to the surface of the first insulating layer 120, with the surface having the micro convex lens 140, the dummy wafer 170 is formed on the surface of the transparent substrate material 160, and then the wafer 110 is thinned by grinding. In this process, the transparent substrate material 160 provides more mechanical support force for the wafer 110, therefore, the wafer 110 can become thinner by grinding, and thus the CMOS image sensor encapsulation structure 100 is characterized in that the structure is formed in a thin shape. Besides, the second installation area 172 has the protection glue layer 180, wherein the protection glue layer 180 can prevent oxygen and moisture from entering the internal elements and absorb scattered light, thus the whole CMOS image sensor encapsulation structure 100 has a longer service life and better use effects. Moreover, in the manufacture process, the transparent substrate material 160 is manufactured in a semiconductor factory, thus the cleanliness is higher, and pollution to the CMOS image sensor encapsulation structure 100 can be avoided.

The above-mentioned are merely for preferred embodiments of the present disclosure and are not intended to limit the present disclosure. For a person skilled in the art, various modifications and changes may be made to the present disclosure. Any amendments, equivalent replacements, improvements and so on, within the spirit and principle of the present disclosure, should be covered by the scope of protection of the present disclosure.

INDUSTRIAL APPLICABILITY

The example of the present disclosure provides a CMOS image sensor encapsulation structure and a method for manufacturing the same. By providing more mechanical support force to the wafer with the transparent substrate material, the wafer can become thinner by grinding; besides, the second installation area has the protection glue layer or the dummy wafer, and the protection glue layer or the dummy wafer can prevent oxygen and moisture from entering the internal elements and absorb scattered light, such that the whole CMOS image sensor encapsulation structure has a longer service life and better use effects.

What is claimed is:

1. A method for manufacturing a CMOS image sensor encapsulation structure, comprising:
    forming a blind hole in a combined layer formed by a first insulating layer and a wafer, wherein the blind hole passes through the first insulating layer with its hole bottom located on the wafer, a surface of the first insulating layer is provided with a micro convex lens, with the surface facing away from the wafer;
    areas where the micro convex lens and the blind hole are located are a first installation area and a second installation area, respectively, the first installation area and the second installation area do not overlap each other;
    forming a second insulating layer on a hole wall of the blind hole, filling an electrically conductive material in the blind hole having the second insulating layer, and making a conductor in the combined layer extend to the surface of the first insulating layer to be electrically connected to the electrically conductive material, with the conductor in signal connection with the micro convex lens and an IC;
    fixing a transparent substrate material on the surface of the first insulating layer, with the surface having the micro convex lens, and providing the transparent substrate material in the first installation area, wherein the transparent substrate material is fixed to a surface of the first insulating layer by a light-transmissive adhesive glue;
    forming a dummy wafer on a surface of the transparent substrate material, and thinning the wafer by grinding such that the electrically conductive material in the blind hole is exposed; and
    forming a third insulating layer on a surface of the wafer that is thinned by grinding and exposing the electrically conductive material, forming metal projections on the third insulating layer and electrically connecting the metal projections to the electrically conductive material, fixing solder balls on the metal projections, and after removing the dummy wafer, forming a protection glue layer on the first insulating layer, wherein the protection glue layer is located in the second installation area.

2. The method for manufacturing a CMOS image sensor encapsulation structure of claim 1, wherein the wafer before being thinned by grinding has a thickness of 700~1000 μm, and the wafer after being thinned by grinding has a thickness of 20~1000 μm.

3. The method for manufacturing a CMOS image sensor encapsulation structure of claim 2, wherein the wafer after being thinned by grinding has a thickness of 40~70 μm.

4. The method for manufacturing a CMOS image sensor encapsulation structure of claim 1, wherein the protection glue layer is substantially flush with a surface of the transparent substrate material.

5. The method for manufacturing a CMOS image sensor encapsulation structure of claim 1, wherein the electrically conductive material includes copper, silver, or gold.

6. The method for manufacturing a CMOS image sensor encapsulation structure of claim 1, wherein the light-transmissive adhesive glue contacts a whole surface of the transparent substrate material.

7. The method for manufacturing a CMOS image sensor encapsulation structure of claim 1, wherein materials of the transparent substrate material include sapphire, quartz glass and magnesium oxide.

8. The method for manufacturing a CMOS image sensor encapsulation structure of claim 1, wherein the solder balls are welded to the metal projections.

9. A CMOS image sensor encapsulation structure, comprising a first insulating layer, a wafer, a second insulating layer, a transparent substrate material, and a dummy wafer,
    wherein the first insulating layer is provided on a side of the water and forms a combined layer together with the wafer, wherein two sides of the combined layer are respectively provided with a blind hole, the blind holes pass through the first insulating layer and hole bottoms are located on the wafer, a surface of the first insulating layer facing away from the wafer is provided with a micro convex lens, areas where the micro convex lens and the blind holes are located are a first installation area and a second installation area, respectively, and the first installation area and the second installation area do not overlapping each other;
    the second insulating layer is provided on the hole walls of the blind holes, and an electrically conductive material is accommodated in the blind holes provided with the second insulating layer, and a conductor located in the combined layer and in signal connection with both the micro convex lens and an IC is electrically connected to the electrically conductive material;
    and the transparent substrate material is fixed on a surface of the first insulating layer, with the surface provided with the micro convex lens, wherein the transparent substrate material is fixed to the surface of the first insulating layer by a light-transmissive adhesive glue, and the dummy wafer is provided on a surface of the transparent substrate material, so as to thin the wafer by grinding such that the electrically conductive material in the blind holes is exposed.

10. The CMOS image sensor encapsulation structure of claim 9, further comprising a third insulating layer, wherein the third insulating layer is formed on a surface of the wafer after being thinned by grinding, such that the electrically conductive material is exposed.

11. The CMOS image sensor encapsulation structure of claim 10, further comprising metal projections and solder balls, wherein the metal projections are formed on the third insulating layer and electrically connected to the electrically conductive material, the solder balls are fixed on the metal projections, such that the metal projections are electrically connected to a system base board via the solder balls.

12. The CMOS image sensor encapsulation structure of claim 9, further comprising a protection glue layer, wherein the protection glue layer is formed on the first insulating layer after the dummy wafer is removed, and the protection glue layer is located in the second installation area so as to prevent oxygen and moisture from entering the CMOS image sensor encapsulation structure.

13. The CMOS image sensor encapsulation structure of claim 9,
    wherein materials of the transparent substrate material include sapphire, quartz glass and magnesium oxide.

14. The CMOS image sensor encapsulation structure of claim 9, wherein the wafer before being thinned by grinding has a thickness of 700~1000 μm, and the wafer after being thinned by grinding has a thickness of 20~100 μm.

15. The CMOS image sensor encapsulation structure of claim 14, wherein the wafer after being thinned by grinding has a thickness of 40~70 μm.

16. The CMOS image sensor encapsulation structure of claim 9, wherein the electrically conductive material includes copper, silver, or gold.

* * * * *